(12) United States Patent
Cho et al.

(10) Patent No.: US 10,654,130 B2
(45) Date of Patent: May 19, 2020

(54) POLARIZATION MODULE AND LASER APPARATUS INCLUDING THE SAME

(71) Applicant: SAMSUNG DISPLAY CO., LTD., Yongin-si, Gyeonggi-Do (KR)

(72) Inventors: Joo Woan Cho, Seongnam-si (KR); Byoung Ho Cheong, Yongin-si (KR); Oleg Prudnikov, Hwaseong-si (KR); Jeong Kyun Na, Suwon-si (KR); Joon-Hwa Bae, Suwon-si (KR); Seung Hwan Lee, Seoul (KR); Byoung Kwon Choo, Hwaseong-si (KR)

(73) Assignee: SAMSUNG DISPLAY CO., LTD, Yongin-si, Gyeonggi-Do ( * ) Notice: Subject to any disclaimer, the term of this patent is extended or adjusted under 35 U.S.C. 154(b) by 910 days.

(21) Appl. No.: 15/175,649

(22) Filed: Jun. 7, 2016

(65) Prior Publication Data
US 2017/0087664 A1 Mar. 30, 2017

(30) Foreign Application Priority Data
Sep. 30, 2015 (KR) .......................... 10-2015-0137885

(51) Int. Cl.
*G02B 5/30* (2006.01)
*G02B 27/28* (2006.01)
(Continued)

(52) U.S. Cl.
CPC .......... *B23K 26/354* (2015.10); *B23K 26/067* (2013.01); *B23K 26/073* (2013.01);
(Continued)

(58) Field of Classification Search
CPC ................ G02B 27/283; G02B 27/286; G02B 27/0172; G02B 27/26; G02B 27/0178;
(Continued)

(56) References Cited

U.S. PATENT DOCUMENTS

| 5,212,710 A | 5/1993 | Kaneda et al. |
| 7,331,676 B2 | 2/2008 | Ferber et al. |

(Continued)

FOREIGN PATENT DOCUMENTS

| CN | 1678426 | 10/2005 |
| CN | 101765799 | 6/2010 |

(Continued)

OTHER PUBLICATIONS

Extended European Search Report dated Feb. 22, 2017 for European Patent Application No. 16177264.5.
(Continued)

*Primary Examiner* — William R. Alexander
*Assistant Examiner* — Tamara Y. Washington
(74) *Attorney, Agent, or Firm* — F. Chau & Associates, LLC

(57) ABSTRACT

A polarization module and a laser exposure apparatus have a polarization module including a first lens and a second lens that reduce a one-directional length of a cross-section of an incident laser beam having an optical axis. A polarization beam splitter divides the laser beam passing through the first and second lenses into two laser beams that are polarized in different directions with respect to each other. A first prism lens and a second prism lens emit an output laser beam by controlling the two laser beams that are divided by the polarization beam splitter to positions that are symmetrical with respect to the optical axis. At least one half wave plate is disposed between the polarization beam splitter and the first prism lens.

20 Claims, 9 Drawing Sheets

(51) Int. Cl.
| | |
|---|---|
| *B23K 26/354* | (2014.01) |
| *G02B 27/09* | (2006.01) |
| *G03F 7/20* | (2006.01) |
| *B23K 26/067* | (2006.01) |
| *B23K 26/073* | (2006.01) |
| *G02B 5/04* | (2006.01) |
| *G02B 13/02* | (2006.01) |

(52) U.S. Cl.
CPC ............. *G02B 5/04* (2013.01); *G02B 5/3083* (2013.01); *G02B 13/02* (2013.01); *G02B 27/0905* (2013.01); *G02B 27/0955* (2013.01); *G02B 27/283* (2013.01); *G02B 27/286* (2013.01); *G03F 7/70566* (2013.01)

(58) Field of Classification Search
CPC .... G02B 5/3083; G02B 5/30; G03B 21/2073; G03B 21/14; G03B 21/28
USPC ........................................ 359/489.08–489.13
See application file for complete search history.

(56) References Cited

U.S. PATENT DOCUMENTS

| | | | |
|---|---|---|---|
| 8,299,553 | B2 | 10/2012 | Kawakami et al. |
| 8,446,924 | B2 | 5/2013 | Kawaguchi et al. |
| 8,867,036 | B2 | 10/2014 | Agawa |
| 9,058,994 | B2 | 6/2015 | Kawakami et al. |
| 2007/0075058 | A1 | 4/2007 | Ehrmann et al. |
| 2008/0180934 | A1 | 7/2008 | Oka et al. |
| 2009/0109417 | A1 | 4/2009 | Tanitsu |
| 2009/0122272 | A1 | 5/2009 | Silverstein et al. |
| 2012/0249989 | A1 | 10/2012 | Fujii |
| 2014/0291308 | A1 | 10/2014 | Lasagni et al. |
| 2015/0060421 | A1 | 3/2015 | Tami et al. |

FOREIGN PATENT DOCUMENTS

| | | |
|---|---|---|
| CN | 102679907 | 9/2012 |
| CN | 103344198 | 10/2013 |
| CN | 104259657 | 1/2015 |
| DE | 102011079837 | 1/2013 |
| EP | 0459503 A2 | 12/1991 |
| EP | 0508413 | 10/1992 |
| EP | 0369986 | 10/1994 |
| JP | H02148874 | 6/1990 |
| JP | H11176011 | 7/1999 |
| KR | 10-1992-0001788 | 1/1992 |
| KR | 1002760810000 | 9/2000 |
| KR | 1011135880000 | 2/2012 |
| KR | 1020140071832 | 6/2014 |
| TW | 200925770 | 6/2009 |
| WO | WO2009061357 | 5/2009 |
| WO | WO2011105189 | 9/2011 |

OTHER PUBLICATIONS

Susumu Horita et al., "Surface Modification of an Amorphous Si Thin Film Crystallized by a Linearly Polarized ND: Yag Pulse Laser Beam", Journal of Applied Physics, 102, (2007), p. 013501-1-013501-10.

Mutsuko Hatano et al.,"Excimer Laser-Induced Temperature Field in Melting and Resolidification of Silicon Thin Films", Journal of Applied Physics, 87, (2000), p. 36-43.

Zhou Guosheng et al., "Growth of Spontaneous Periodic Surface Structures on Solids During Laser Illumination", Physical Review B, vol. 26, No. 10, Nov. 15, 1982, p. 5366-5381.

POLARIZATION MODULE AND LASER APPARATUS INCLUDING THE SAME

CROSS-REFERENCE TO RELATED APPLICATION

This application claims priority to and the benefit of Korean Patent Application No. 10-2015-0137885, filed in the Korean Intellectual Property Office on Sep. 30, 2015, the entire contents of which are incorporated by reference herein.

TECHNICAL FIELD

The present invention relates to a polarization module, and more particularly, to a polarization module and a laser apparatus including the same.

DISCUSSION OF THE RELATED ART

A polycrystalline semiconductor, such as polycrystalline silicon, is widely used as an active layer of a transistor included in a variety of electronic apparatuses. Polycrystalline semiconductors have higher electromigration than amorphous silicon.

Examples of methods of forming a polycrystalline semiconductor, such as polycrystalline silicon, include a solid phase crystallization (SPC) method, a metal induced crystallization (MIC) method, a metal induced lateral crystallization (MILC) method, a laser annealing method, and the like. Among them, the laser annealing method for crystallizing an amorphous substance, such as amorphous silicon, by using a laser beams having high energy to irradiate an amorphous silicon film, is frequently used in a manufacturing process of an electronic device such as an organic light emitting diode display (OLED) or a liquid crystal display (LCD). In particular, excimer laser annealing (ELA) using excimer lasers is mainly used.

The laser annealing method serves to crystallize at least a portion of the amorphous substance such as the amorphous silicon film into a polycrystalline substance such as polycrystalline silicon by irradiating the amorphous substance film with a laser apparatus. The quality of a polycrystalline transistor is affected by a degree of grain alignment of the crystallized semiconductor, and a multi-shot method of irradiating a portion of an amorphous semiconductor layer with a plurality of shots in the crystallizing process is employed to increase the grain alignment of the crystallized semiconductor such as crystallized silicon. In the multi-shot method, the portion of the amorphous semiconductor layer is irradiated substantially 20 times or more.

SUMMARY

Exemplary embodiments of the present invention provide a polarization module that is capable of outputting a laser beam having a position and a magnitude that are the same as those of an introduced laser beam by adjusting a polarized state of a laser beam having random polarization.

Exemplary embodiments of the present invention provide a laser apparatus capable of increasing grain alignment of a polycrystalline substance such as polycrystalline silicon.

An exemplary embodiment of the present invention provides a polarization module including a first lens and a second lens that reduce a one-directional length of a cross-section of an incident laser beam that is introduced with an optical axis. A polarization beam splitter divides the laser beam passing through the first and second lenses into two laser beams that are polarized in different directions from each other. A first prism lens and a second prism lens emit an output laser beam by controlling the two laser beams that are divided by the polarization beam splitter to positions that are symmetrical with respect to the optical axis. At least one half wave plate is disposed between the polarization beam splitter and the first prism lens.

An exemplary embodiment of the present invention provides a laser apparatus including a polarization module and an optical system configured to make a laser beam emitted from the polarization module more uniform. The polarization module includes a first lens and a second lens that reduce a one-directional length of a cross-section of at least one incident laser beam that is introduced with an optical axis. A polarization beam splitter divides the laser beam passing through the first and second lenses into two laser beams that are polarized in different directions from each other. A first prism lens and a second prism lens emit an output laser beam by controlling the two laser beams that are divided by the polarization beam splitter to positions that are symmetrical with respect to the optical axis. At least one half wave plate is disposed between the polarization beam splitter and the first prism lens.

An area of a cross-section of the output laser beam may be substantially the same as an area of the cross-section of the incident laser beam.

The output laser beam may include a first output laser beam and a second output laser beam that have a same polarization direction.

A shape of the cross-section of the output laser beam may be substantially the same as a shape of the cross-section of the incident laser beam.

The first prism lens may include a first optical plane and a second optical plane that have slopes that are asymmetrical with respect to each other.

The second prism lens may have a shape that is the same as a shape of the first prism lens, and the second prism lens may be disposed in a direction that is different from a direction of disposition of the first prism lens.

Central axes of the first prism lens and the second prism lens may be misaligned from each other.

The first lens and the second lens may be telescopic lenses having different focal distances from each other.

The at least one half wave plate may include a first half wave plate disposed on a passing path of a first laser beam which is one of the two laser beams that are divided by the polarization beam splitter and a second half wave plate disposed on a passing path of a second laser beam which is the other of the two laser beams. A difference between rotation angles of the first half wave plate and the second half wave plate may be substantially 45 degrees.

At least one mirror is configured to reflect the second laser beam at least one time and then the second laser beam is introduced into the second half wave plate.

The at least one incident laser beam may include a first incident laser beam and a second incident laser beam. The first lens and the second lens, the polarization beam splitter, and the first prism lens may be arranged on an optical axis of the first incident laser beam. The laser apparatus may further include a third lens and a fourth lens, an additional polarization beam splitter, and a third prism lens that are arranged on an optical axis of the second incident laser beam.

The first output laser beam and the second output laser beam may be separated from each other at a first distance, and the first distance may be an integer multiple of a pitch of lenses of at least one lens array unit included in the optical system.

The optical system may include at least one lens array unit and a laser beam blocking member disposed to correspond to a boundary between the first output laser beam and the second output laser beam.

According to an exemplary embodiment of the present invention, a polarization module is provided that is capable of outputting a laser beam having a position and a magnitude that are the same as those of an introduced laser beam by adjusting a polarized state of a laser beam having random polarization. Accordingly, it is unnecessary to remodel the optical system after the polarization module, and thus it is possible to use the laser beam that is polarized by applying the polarization module according to the exemplary embodiment of the present invention to a conventional optical system including the laser apparatus.

Further, a polycrystalline substance such as polycrystalline silicon can be formed by using the laser apparatus including the polarization module according to an exemplary embodiment of the present invention, thereby increasing grain alignment of the polycrystalline substance such as the polycrystalline silicon. Accordingly, the number of shots may be reduced in the laser annealing process using laser annealing so as to simplify the crystallization process.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF THE EMBODIMENTS

Figure 1:
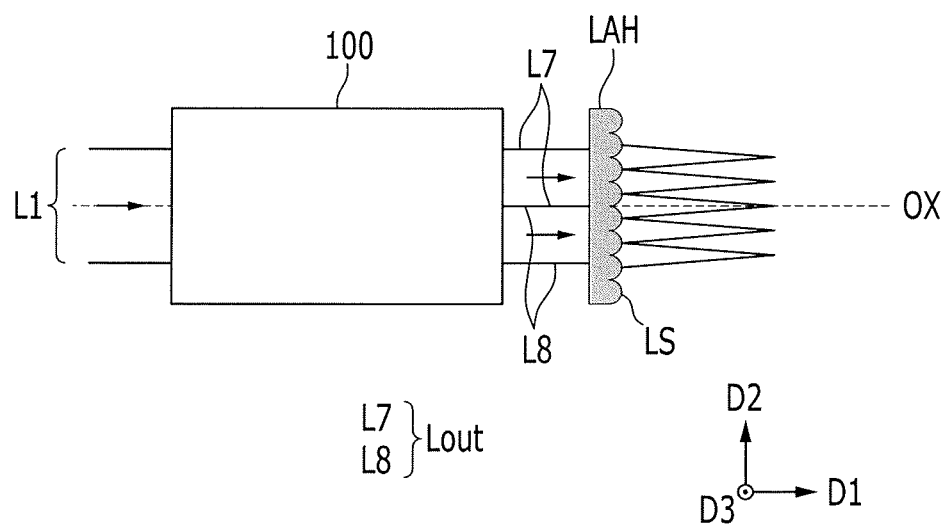
FIG. 1 is a schematic diagram illustrating a polarization module according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The drawings are schematic and are not necessarily drawn to scale. The relative sizes and ratios of the parts in the drawings may be exaggerated or reduced for clarity and convenience. The same structures, elements, or parts illustrated may be denoted by the same reference numerals in multiple drawings in order to represent similar characteristics. When a part is referred to as being "on" another part, it can be directly on the other part or intervening parts may also be present.

Like numerals may refer to like or similar constituent elements throughout the specification and drawings.

Hereinafter, a polarization module and a laser apparatus including the same according to an exemplary embodiment of the present invention will be described in detail with reference to the accompanying drawings.

First, a polarization module according to an exemplary embodiment of the present invention will be described with reference to FIG. 1.

FIG. 1 is a schematic diagram illustrating a polarization module according to an exemplary embodiment of the present invention.

Referring to FIG. 1, the polarization module 100 according to an exemplary embodiment of the present invention emits an output laser beam Lout including a laser beam L7 and a laser beam L8 by converting an introduced laser beam L1. The introduced laser beam L1 is unpolarized, and the emitted laser beams L7 and L8 are linearly polarized. The polarized state of the laser beam L7 and L8 are controlled by the polarization module 100.

Specifically, the laser beam L1 may include both of a p-polarized component and an s-polarized component, and the laser beams L7 and L8 may include one of the p-polarized component and the s-polarized component, or may be linearly polarized in predetermined directions, respectively. Polarized directions of the emitted laser beams L7 and L8 are the same as or different from each other. When the polarized directions of the laser beams L7 and L8 are the same as each other, the two laser beams L7 and L8 emitted from the polarization module 100 are polarized in one direction. When the polarized directions of the laser beams L7 and L8 are different from each other, the output laser beam Lout obtained by summing the two laser beams L7 and L8 is unpolarized.

Herein, the p-polarization indicates a polarization state in which an electric field of light has a vibration direction that is parallel with an incident plane thereof, and the s-polarization indicates a polarization state in which the electric field of light has a vibration direction that is perpendicular to the incident plane thereof. The incident plane indicates a plane including a normal direction of a specimen plane and a passing direction of light.

In the present exemplary embodiment, when a central axis of the passing direction of the laser beam L1 introduced to the polarization module 100 (polarizer) is referred to as an optical axis OX, the two laser beams L7 and L8 emitted from the polarization module 100 may pass symmetrically with respect to the optical axis OX. For example, when the center of a cross-section of the laser beam L1 is positioned on the optical axis OX, cross-sections of the two laser beams L7 and L8 may be symmetrical to each other with respect to the optical axis OX. A direction of the optical axis OX may be the same as a first direction D1 shown in FIG. 1, and a second direction D2 is perpendicular to the first direction D1, or the second direction D2 is perpendicular to a plane including a normal direction of the plane of various optical devices (a lens, a beam splitter, a mirror, and the like) shown in FIG. 1 and the optical axis OX. A third direction D3 is perpendicular to the first direction D1 and the second direction D2.

As shown in FIG. 1, the two laser beams L7 and L8 are adjacently emitted as one continuous output laser beam Lout, or a space may exist between the two laser beams L7 and L8.

When the two laser beams L7 and L8 are adjacently emitted, e.g., with no space provided therebetween, the shape and area of the cross-section of the output laser beam Lout obtained by summing the two laser beams L7 and L8 emitted from the polarization module 100 may be substantially the same as those of the cross-section of the laser beam L1 introduced into the polarization module 100. For example, the area of the output laser beam Lout may be substantially half of the area of the laser beam L1 introduced into the polarization module 100. For example, in the case that a laser beam is generated to have a rectangular cross-section, when the direction of a long side of the rectangular cross-section is referred to as a major axis, each length of the laser beams L7 and L8 in the major-axis direction is substantially half of the length of the laser beam L1 in the major-axis direction.

When the two laser beams L7 and L8 are separately emitted, the sum of the areas of the cross-sections of the two laser beams L7 and L8 may be substantially the same as that of the cross-section of the laser beam L1, and the shapes of the cross-sections of the two laser beams L7 and L8 that are closely set to be adjacent to each other in the optical axis OX may be substantially the same as that of the cross-section of the laser beam L1.

For example, the laser beams L7 and L8 emitted from the polarization module 100 are outputted as the output laser beam Lout having the entire shape that is substantially the same as that of the firstly introduced laser beam L1. Accordingly, it is possible to use the output laser beam Lout including the laser beams L7 and L8 as it is without remodeling an optical system that is conventionally used with only the firstly introduced laser beam L1. For example, when the optical system is a homogenizer including a lens array unit LAH, the laser beams L7 and L8 are introduced into the homogenizer, thereby being converted into laser beams having a rectangular cross-section while having uniform energy distribution. The lens array unit LAH includes a plurality of lenses LS. The laser beams L7 and L8 introduced into the lens array unit LAH is divided in a major-axis direction of the rectangular laser beam. The divided laser beams may be converted into a rectangular laser beam having uniform energy distribution by being overlapped on the same plane through a plurality of lenses and a different lens array.

Hereinafter, a detailed structure of the polarization module 100 according to an exemplary embodiment of the present invention will be described with reference to FIG. 2A to FIG. 7.

Figure 2A:
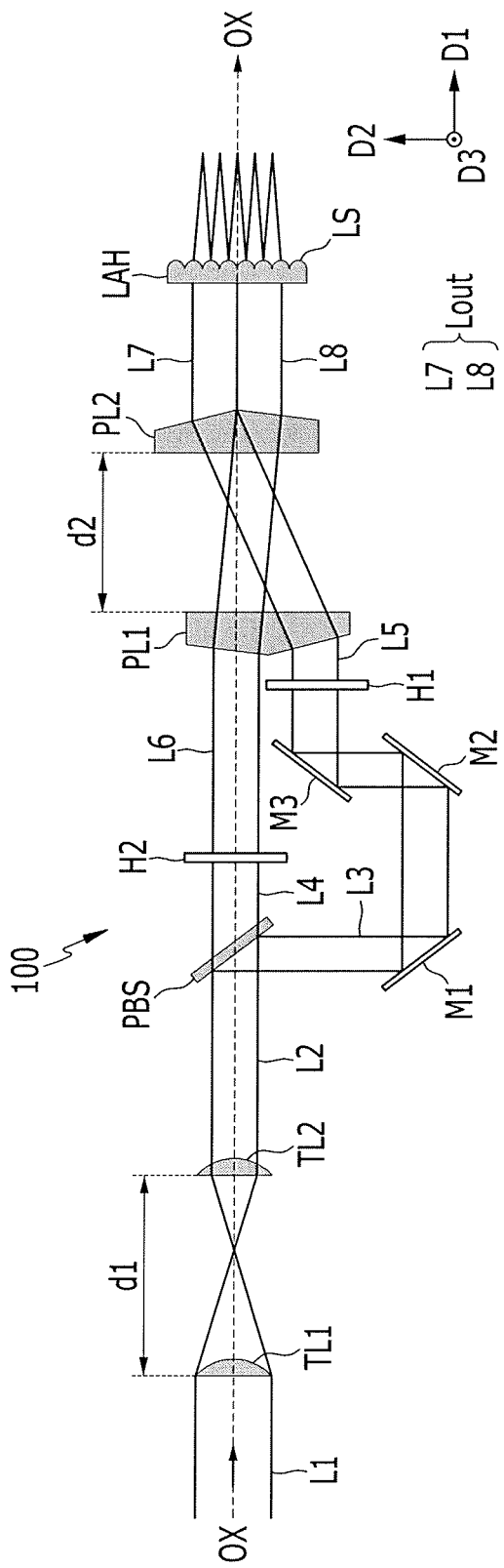
FIG. 2A a schematic diagram illustrating a structure of a polarization module according to an exemplary embodiment of the present invention.
Figure 2B:
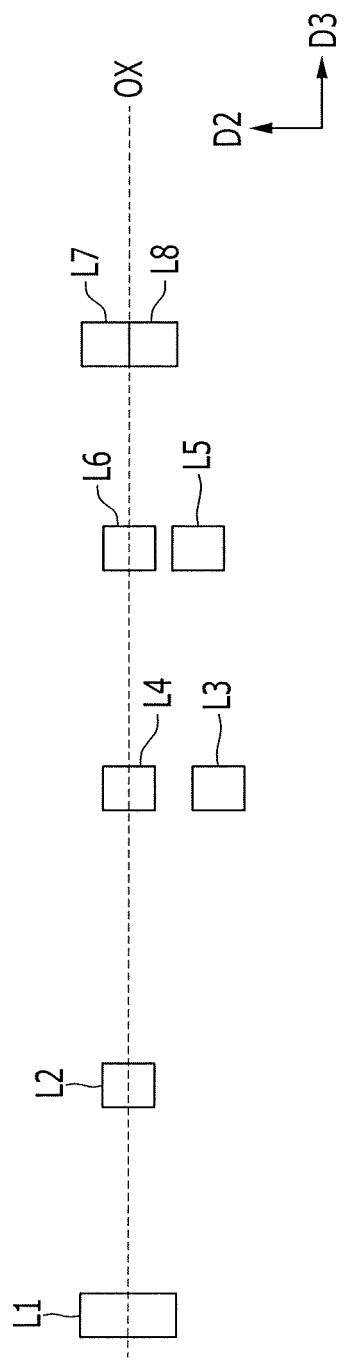
FIG. 2B is a diagram illustrating showing a cross-sectional shape of a laser beam passing through the polarization module shown in FIG. 2A.
Figure 3:
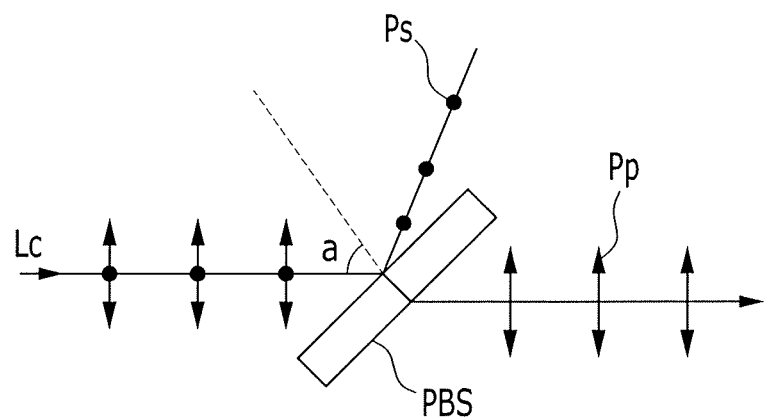
FIG. 3 is a diagram illustrating a polarization beam splitter and a polarized state of light according to an exemplary embodiment of the present invention.
Figure 4:
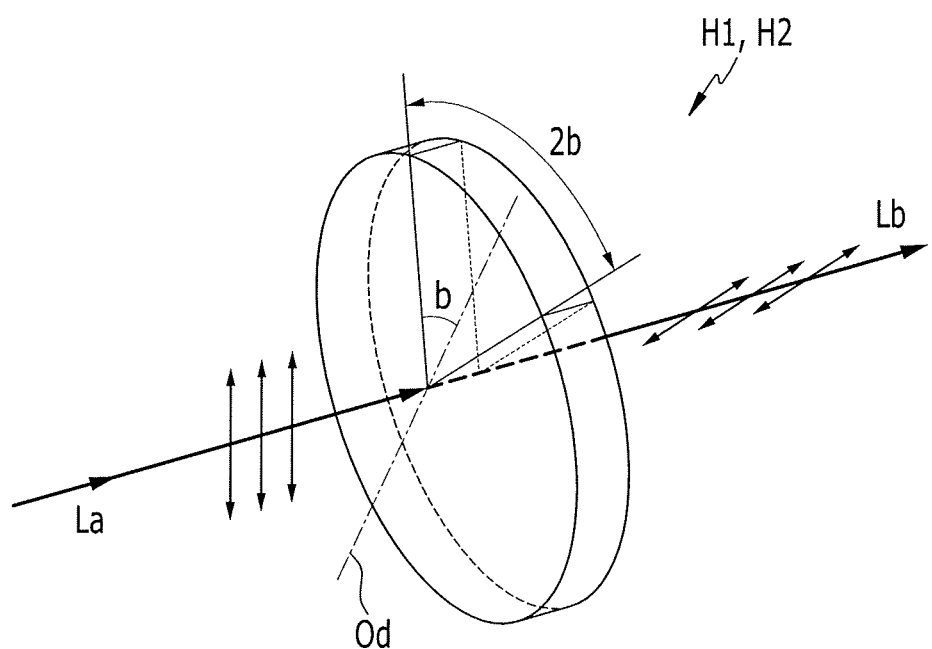
FIG. 4 is a diagram illustrating a half wave plate and a polarized state according to an exemplary embodiment of the present invention.
Figure 5:
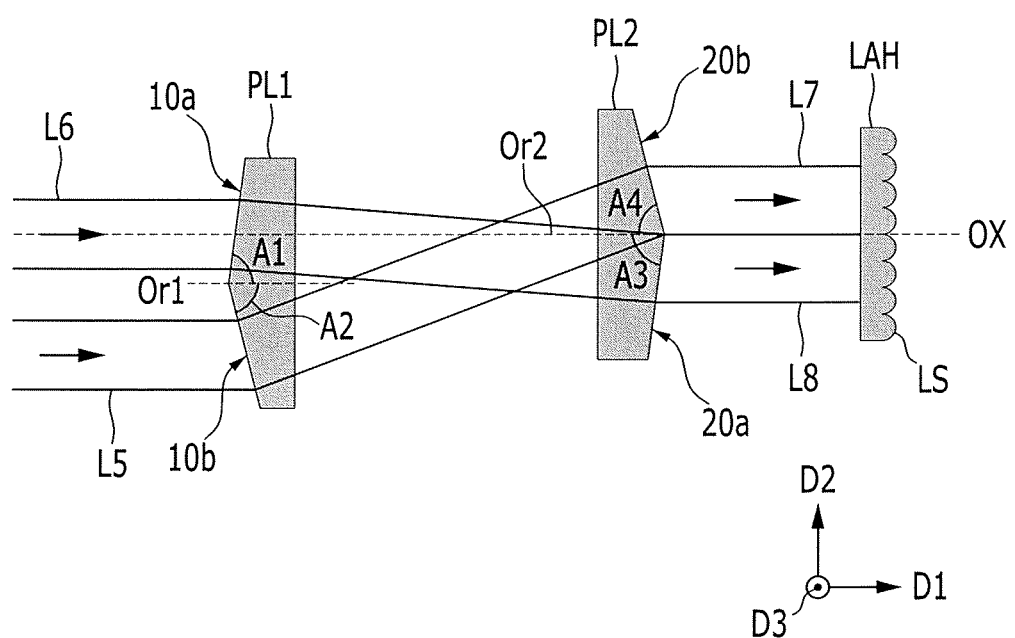
FIG. 5, FIG. 6, and FIG. 7 are diagrams illustrating prism lenses included in a polarization module and a light passing state according to an exemplary embodiment of the present invention.
Figure 6:
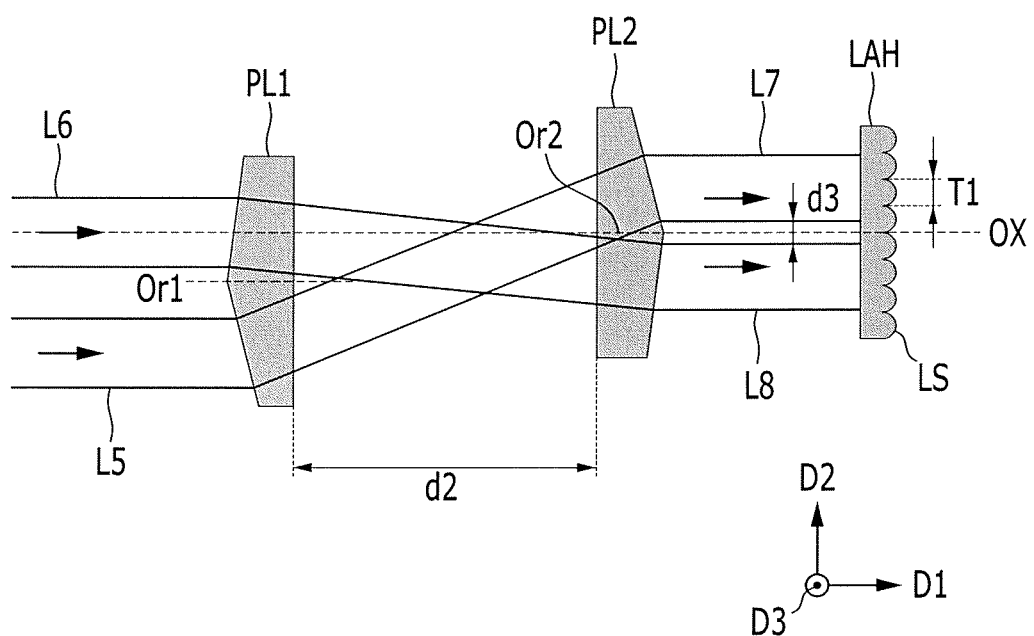
Figure 7:
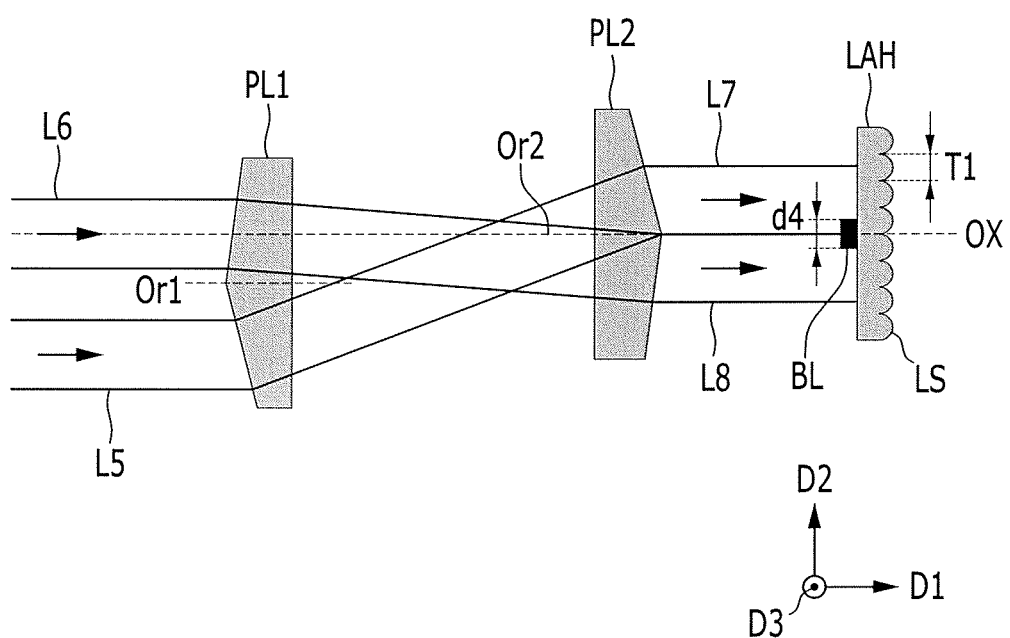

FIG. 2A a schematic diagram illustrating a structure of a polarization module according to an exemplary embodiment of the present invention. FIG. 2B is a diagram illustrating a cross-sectional shape of a laser beam passing through the polarization module shown in FIG. 2A. FIG. 3 is a diagram illustrating a polarization beam splitter and a polarized state of light according to an exemplary embodiment of the present invention. FIG. 4 is a diagram illustrating a half wave plate and a polarized state according to an exemplary embodiment of the present invention. FIG. 5, FIG. 6, and FIG. 7 are diagrams illustrating prism lenses included in a polarization module and a light passing state according to an exemplary embodiment of the present invention.

Referring to FIG. 2A, the polarization module 100 (polarizer) according to an exemplary embodiment of the present invention includes a pair of a first lens TL1 and a second lens TL2, a polarization beam splitter PBS, a first half wave plate H1 and a second half wave plate H2, a plurality of mirrors M1, M2, and M3, and a pair of a first prism lens PL1 and a second prism lens PL2.

The laser beam L1 introduced into the polarization module 100 passes along the optical axis OX with respect to the optical axis OX. The laser beam L1 may be an initial laser beam generated from a laser generator (not illustrated). The laser beam L1 may be unpolarized and may include both of the p-polarized component and the s-polarized component.

Referring to FIG. 2A and FIG. 2B, when substantially passing through the first lens TL1 and the second lens TL2, the laser beam L1 having the rectangular shape is converted into a laser beam L2 with a length in the major-axis direction that is reduced substantially in half. Herein, when a laser beam that is to be finally generated has a rectangular cross-section, the major-axis direction may indicate a direction of a rectangular long side thereof. This is true of descriptions that will be made below.

Each of the first lens TL1 and the second lens TL2 may be a telescopic lens, and focal distances of the two lenses TL1 and TL2 may be different from each other. Each of the first lens TL1 and the second lens TL2 may be a cylindrical lens which is extended in a third direction D3. A reduction ratio of the laser beam L2 to the laser beam L1 can be controlled by adjusting a distance d1 between the first lens TL1 and the second lens TL2.

The laser beam L2 is introduced into the polarization beam splitter PBS. The polarization beam splitter divides the laser beam L2 into two laser beams L3 and L4 by partially reflecting and transmitting the laser beam L2. The laser beam L3 is a laser beam that is reflected by the polarization beam splitter PBS, and the laser beam L4 is a laser beam that is transmitted by the polarization beam splitter PBS.

Referring to FIG. 3, in the case that an incident beam Lc has a p-polarized component Pp and an s-polarized component Ps, the polarization beam splitter may transmit the p-polarized component Pp and may reflect the s-polarized component Ps, and vice versa. An angle 'a' between a normal direction to a plane of the polarization beam splitter PBS and a passing direction of the incident beam Lc may be in a range of substantially 45 degrees to 60 degrees. The polarization beam splitter PBS may include a dielectric material. For example, the polarization beam splitter may be formed of fused silica.

Referring to FIG. 2A, the laser beam L3 and the laser beam L4 outputted from the polarization beam splitter PBS are polarized in different directions from each other. For example, when the laser beam L3 is s-polarized, the laser beam L4 is p-polarized. As described herein, the laser beam L3 is assumed to be s-polarized and the laser beam L4 is assumed to be p-polarized, however, the reverse may also be the case.

The laser beam L3 is sequentially reflected by a plurality of mirrors M1, M2, and M3, and then passes through the half wave plate H1 to be converted into a laser beam L5. Thereafter, it is introduced to the first prism lens PL1. FIG. 2A illustrates an exemplary arrangement for the three mirrors M1, M2, and M3, but the number of mirrors is not limited to the three shown. For example, the number of the mirrors may be adjusted to introduce the laser beam L3 into an appropriate position of the first prism lens PL1 after passing through the half wave plate H1.

The laser beam L4 passes through the half wave plate H2 to be converted into a laser beam L6, and is then introduced into the first prism lens PL1.

The half wave plate H1 may or may not change a polarization direction of the laser beam L3. Similarly, the half wave plate H2 may or may not change a polarization direction of the laser beam L4. Referring to FIG. 4, when an optical axis Od of the half wave plates H1 and H2 and the polarization direction of an incident beam La forms an angle 'b,' the half wave plates H1 and H2 may output an emission beam Lb of which polarization direction is rotated by 2b from the polarization direction of the incident beam La. The angle b between the polarization direction of the incident beam La and the optical axis Od of the half wave plates H1 and H2 is referred to as a rotation angle of the half wave plates H1 and H2. When the rotation angle of the half wave plates H1 and H2 is 45 degrees, a p-polarized beam is converted into an s-polarized beam by passing through the half wave plates H1 and H2, and vice versa.

For example, when the rotation angles of the half wave plate H1 and the half wave plate H2 are respectively set as 90 and 0 degrees, the laser beam L5 passing through the half wave plate H1 is s-polarized similar to the laser beam L3, and the laser beam L6 passing through the half wave plate H2 is p-polarized similar to the laser beam L4. Accordingly, the laser beams L5 and L6 constitute an overall unpolarized laser beam even when focusing on the optical axis OX.

For example, when the rotation angles of the half wave plate H1 and the half wave plate H2 are respectively set as 45 and 0 degrees, the laser beam L5 passing through the half wave plate H1 is p-polarized unlike the laser beam L3, and the laser beam L6 passing through the half wave plate H2 is p-polarized similar to the laser beam L4. Accordingly, the laser beams L5 and L6 constitute a laser beam polarized in one polarization direction overall, e.g., a p-polarized laser beam, when focusing on the optical axis OX.

For example, when the rotation angles of the half wave plate H1 and the half wave plate H2 are respectively set as 90 and 45 degrees, the laser beam L5 passing through the half wave plate H1 is s-polarized similar to the laser beam L3, and the laser beam L6 passing through the half wave plate H2 is s-polarized unlike the laser beam L4. Accordingly, the laser beams L5 and L6 constitute a laser beam polarized in one polarization direction, e.g., an s-polarized laser beam, when focusing on the optical axis OX.

For example, when the rotation angles of the half wave plate H1 and the half wave plate H2 are respectively set as 45+θ/2 and θ/2 degrees, the polarization direction of the laser beam L5 is rotated by 90+θ based on the polarization direction of the laser beam L3, and the polarization direction of the laser beam L6 is rotated by θ based on the polarization direction of the laser beam L4. Accordingly, the laser beams L5 and L6 constitute a laser beam linearly polarized in one polarization direction, e.g., in a direction of the same angle θ based on the polarization direction of the laser beam L4 when focusing on the optical axis OX.

The rotation angles of the half wave plate H1 and the half wave plate H2 form 45 degrees, the laser beams L5 and L6 may constitute the output laser beam Lout that is linearly polarized in one polarization direction. By adjusting the rotation angles of the half wave plate H1 and half wave plate H2, it is possible to control the polarization directions of the laser beams L5 and L6 and it is also possible to differently control the polarization directions of the laser beams L5 and L6.

One of the two half wave plates H1 and H2 may be omitted when it is necessary to obtain a p- or s-polarized output laser beam.

Both of the laser beams L5 and L6 sequentially pass through the first prism lens PL1 and the second prism lens PL2 to be emitted as a laser beam L7 and a laser beam L8 that are symmetrical to each other with respect to the optical axis OX. Referring to FIG. 2A, when shapes of the first prism lens PL1 and the second prism lens PL2 are determined, positions of the laser beams L7 and L8 are controlled to be symmetrical with respect to the optical axis OX by adjusting a distance d2 between the first prism lens PL1 and the second prism lens PL2.

In describing FIG. 5, it is noted that laser beams L7 and L8 may be substantially the same as those described above and so no additional description of these elements will be provided. Referring to FIG. 5, the first prism lens PL1 and the second prism lens PL2 may respectively have optical planes 10a and 10b, and 20a and 20b, that have asymmetric slopes with respect to the first direction D1 such that the laser beam L5 and the laser beam L6 focus on the same optical axis OX. For example, an angle A1 between the optical plane 10a of the first prism lens PL1 and the first direction D1 may be greater than an angle A2 between the optical plane 10b of the first prism lens PL1 and the first direction D1, and an angle A3 between of the optical plane 20a of the second prism lens PL2 and the first direction D1 may be greater than an angle A4 between the optical plane 20b of the second prism lens PL2 and the first direction D1. Accordingly, the laser beams passing through the optical planes 10a and 10b, and 20a and 20b, having different slopes may be refracted to have different magnitudes.

The first prism lens PL1 and the second prism lens PL2 may have the same shape but are disposed such that upper, lower, left, and right sides of the first prism lens PL1 and the second prism lens PL2 are opposite to each other when viewed from a plane defined by a second direction D2 and a third direction D3. Accordingly, the slope of the optical plane 10a of the first prism lens PL1 is substantially the same as that of the optical plane 20a of the second prism lens PL2, and the slope of the optical plane 10b of the first prism lens PL1 is substantially the same as that of the optical plane 20b of the second prism lens PL2.

A central axis Or1 serving as a boundary between the optical plane 10a and the optical plane 10b in the first prism lens PL1 might not be aligned with a central axis Or2 serving as a boundary between the optical plane 20a and the optical plane 20b in the second prism lens PL2.

Referring to FIG. 5, the laser beams L7 and L8 passing through the first and second prism lens PL1 and PL2 are adjacently outputted with no separation therebetween, for example, as a single laser beam to be inputted into a homogenizer including a lens array unit LAH.

Alternatively, referring to FIG. 6, the laser beams L7 and L8 passing through the first and second prism lens PL1 and PL2 are separately outputted with a distance d3 therebetween. In this case, the distance d3 may be an integer multiple of a pitch T1 in the second direction D2 of the lenses LS included in the lens array unit LAH, e.g., a diameter of the lenses LS, to ameliorate the discontinuity of the output laser beam including the two laser beams L7 and L8 which separately pass. FIG. 6 illustrates an example in which the distance d3 is substantially the same as the pitch T1 of the lenses LS.

Referring to FIG. 7, the laser beams L7 and L8 passing through the first and second prism lenses PL1 and PL2 may be controlled so as to form a laser beam that is singular and continuous with respect to the optical axis OX, without overlapping each other, to the greatest extent possible. Thus, there is no space separating beams L7 and L8. However, as shown in FIG. 6, the laser beams L7 and L8 may be separated from or may be overlap each other. A laser beam blocking member BL may be disposed in front of the homogenizer including the lens array unit LAH to ameliorate a discontinuous profile of the output laser beam by the boundary between the two laser beams L7 and L8. FIG. 7 illustrates an example in which the beam blocking member BL is disposed on the surface of the lens array unit LAH into which the laser beams L7 and L8 are introduced. The laser beam blocking member BL is disposed to correspond to the boundary between the two laser beams L7 and L8, and a width of the laser beam blocking member BL in the second direction D2 may be substantially an integer multiple of the pitch T1 of the lenses LS including the lens array unit LAH. In the example shown in FIG. 7, the width d4 of the laser beam blocking member BL in the second direction D2 is substantially the same as the pitch T1 of the lenses LS including the lens array unit LAH.

Referring to FIG. 2B, a major-axis directional length of cross-sections of the laser beams L2, L3, L4, L5, L6, L7, and L8 after the first lens TL1 and the second lens TL2 may be identically maintained. Accordingly, a major-axis directional length of the output laser beam Lout including the two laser beams L7 and L8 outputted from the polarization module 100 may be the same as a major-axis directional of the laser beam L1 introduced into the polarization module 100.

Hereinafter, a laser apparatus according to an exemplary embodiment of the present invention will be described with reference to FIG. 8 as well as the aforementioned drawings.

Figure 8:
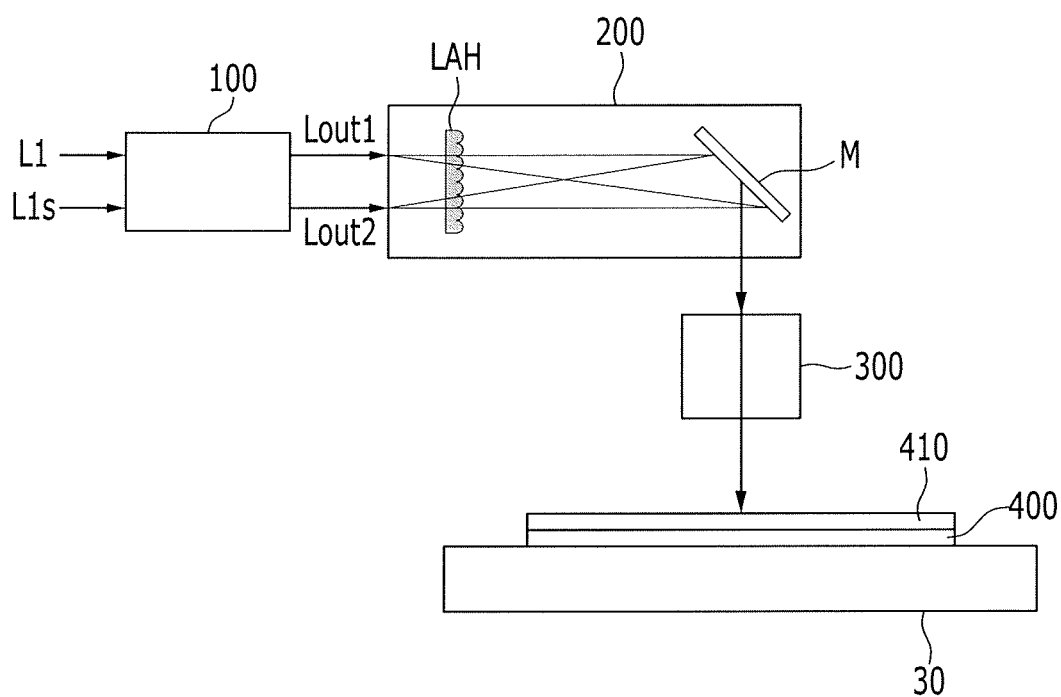
FIG. 8 is a schematic diagram illustrating a laser apparatus according to an exemplary embodiment of the present invention.

FIG. 8 is a schematic diagram illustrating a laser apparatus according to an exemplary embodiment of the present invention.

Referring to FIG. 8, the laser apparatus according to an exemplary embodiment of the present invention includes the polarization module 100, an optical system 200, and an irradiator 300.

A plurality of laser beams L1 and L1s may be introduced into the polarization module 100. According to the approach shown, two laser beams L1 and L1s are introduced into the polarization module 100, however, other numbers of laser beams may be used.

Each description related to the laser beam L1 and the laser beam L1s may be the same as the description related to the laser beam L1 in the aforementioned exemplary embodiment. Each of the laser beam L1 and the laser beam L1s is divided into two laser beams in the polarization module 100, and accordingly, the polarized beams are controlled. Here, four laser beams may pass into the polarization module 100. Before each of the four laser beams are outputted, passing positions thereof are adjusted. As a result, they may be outputted as two output laser beams Lout1 and Lout2.

The output laser beams Lout1 and Lout2 are introduced into the optical system 200, which may be a homogenizer including at least one lens array unit LAH and at least one mirror M. Cross-sectional energy distribution of the laser beams passing through the optical system 200 may be uniformly controlled, and the laser beams may be rectangular laser beams that are extended in a major-axis direction.

A target object may be irradiated by the beams passing through the optical system 200 through the irradiator 300. When the laser apparatus according to exemplary embodiments of the present invention is used for crystallization by laser annealing, the target object, e.g., a target thin film 410, may include an amorphous substance such as amorphous silicon. The target thin film 410 may be disposed on a substrate 400. Further, the substrate 400 may be mounted to a stage 30. The substrate 400 may be a substrate included in various electronic devices such as a liquid crystal display and an organic light emitting diode display.

In a laser annealing process, a laser apparatus or stage is moved in one direction to irradiate the target thin film 410 using the laser beam. In this case, a multi-shot method of irradiating one position 20 times may be used to increase the grain alignment of polycrystalline substance.

However, in some exemplary embodiments of the present invention, the irradiator 300 may be omitted.

According to an exemplary embodiment of the present invention, it is possible to increase the alignment and periodicity of a grain generated when a laser beam is polarized by the polarization module 100 and an amorphous substance such as amorphous silicon is crystallized by using the polarized laser beam. Accordingly, the linearly polarized laser beam may be scattered by a surface of the target thin film 410, and the scattered laser beams and introduced laser beams interfere with each other, thereby forming a periodic grain structure. As described above, the alignment and uniformity of polycrystalline grain may be controlled by adjusting the polarization of the output laser beams Lout, Lout1, and Lout2 outputted to the polarization module 100. Accordingly, the number of shots may be reduced in the laser annealing process of the multi-shot method so as to simplify the crystallization process and increase a margin of an optimized energy density (OPED), thereby increasing a lifespan of the laser apparatus.

The laser beams L1 and L1s introduced into the polarization module 100 according to an exemplary embodiment of the present invention may be controlled to have substantially the same shapes and/or areas as those of the output laser beams Lout1 and Lout2. Accordingly, the optical system 200 may be used with conventionally-equipped apparatus.

Hereinafter, a detailed example of the polarization module 100 shown in FIG. 8 will be described with reference to FIG. 9. The same constituent elements as described above are designated by the same reference numerals, and descriptions thereof will be omitted. While focusing on different elements, detailed descriptions will be provided.

Figure 9:
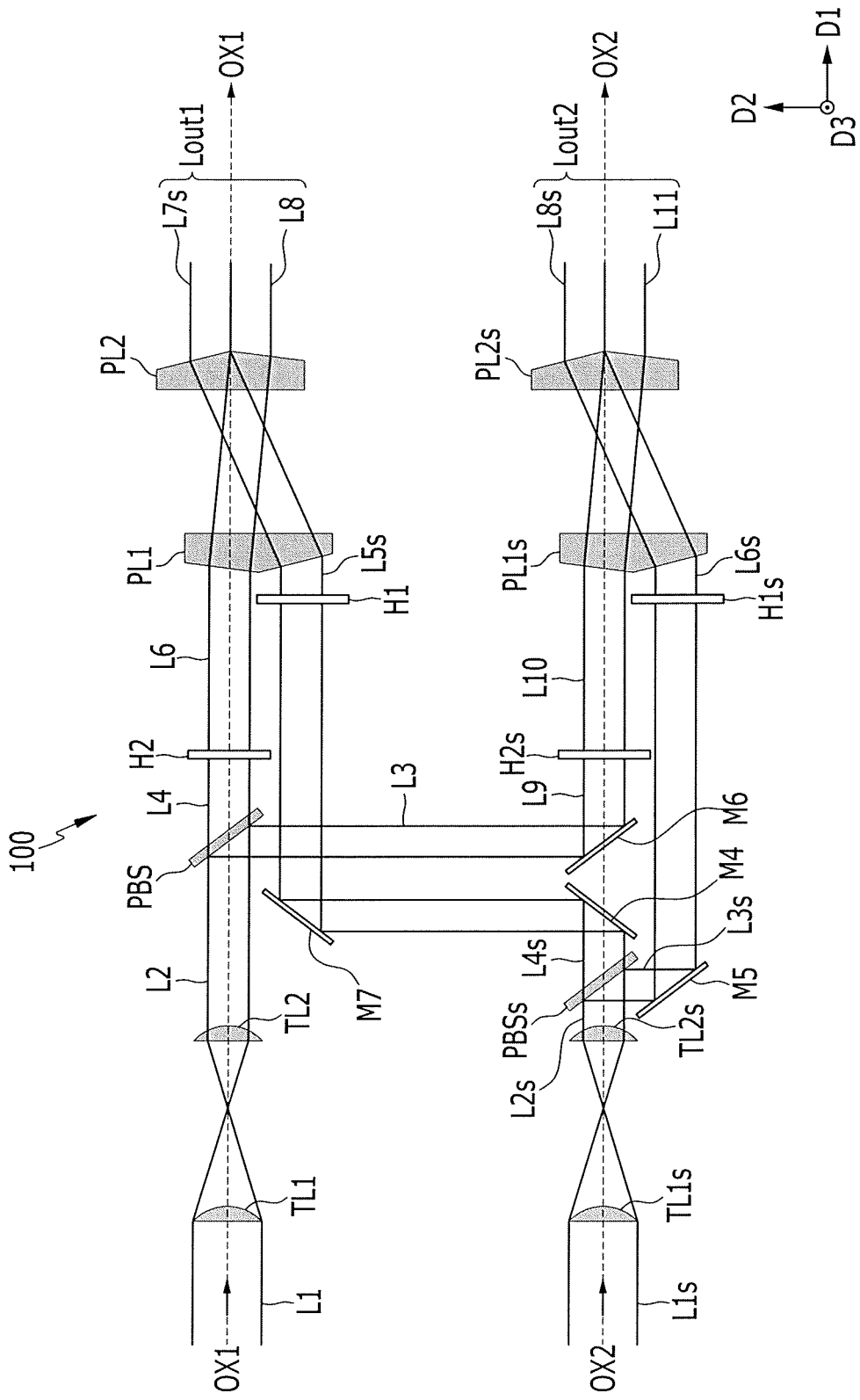
FIG. 9 is a schematic diagram illustrating a polarization module according to an exemplary embodiment of the present invention.

FIG. 9 is a schematic diagram illustrating a polarization module according to an exemplary embodiment of the present invention.

Referring to FIG. 9 as well as FIG. 2A described above, the polarization module 100 according to an exemplary embodiment of the present invention shares many common features with the polarization module shown in FIG. 2A and described above. However, two laser beams L1 and L1s are introduced into the polarization module 100.

The polarization module 100 includes a first lens TL1 and a second lens TL2 arranged along an optical axis OX1, a polarization beam splitter PBS, a first half wave plate H1 and a second half wave plate H2, at least one mirror M7, and a first prism lens PL1 and a second prism lens PL2, and further includes a third lens TL1s and a fourth lens TL2s arranged in another optical axis OX2, a polarization beam splitter PBSs, a third half wave plate H1s and a fourth half wave plate H2s, a plurality of mirrors M4, M5, and M6, and a first prism lens PL1s and a second prism lens PL2s.

The laser beam L1 passes along the optical axis OX1 with respect to the optical axis OX1, and the laser beam L1s passes along the optical axis OX2 with respect to the optical axis OX2. Each of the laser beams L1 and L1s may be an initial laser beam generated from a laser generator (not illustrated). Each of the laser beams L1 and L1s may be nonpolarized to include both of the p-polarized component and the s-polarized component.

When substantially passing through the first lens TL1 and the second lens TL2, the laser beam L1 is converted into a laser beam L2 with a length in the major-axis direction that is reduced substantially by half. When substantially passing through the first lens TL1s and the second lens TL2s, the laser beam L1s is converted into a laser beam L2s with a length in the major-axis direction that is reduced substantially by half. The third lens TL1s and the fourth lens TL2s may respectively be the same as the first lens TL1 and the second lens TL2. This is the same as described above.

The laser beam L2 is divided into two laser beams L3 and L4 which are polarized in different directions from each other by using the polarization beam splitter PBS. The laser beam L2s is divided into two laser beams L3s and L4s which are polarized in different directions from each other by using the polarization beam splitter PBSs. The laser beams L3 and L3s are respectively reflected by the polarization beam splitters PBS and PBSs, and the laser beams L4 and L4s respectively pass through the polarization beam splitters PBS and PBSs.

The laser beam L3 is reflected by at least one mirror M6, and then passes through the half wave plate H2s to be converted into a laser beam L10. Thereafter, it is introduced into the third prism lens PL1s.

The laser beam L4 passes through the half wave plate H2 to be converted into a laser beam L6, and then is introduced into the first prism lens PL1.

The laser beam L3s is reflected by at least one mirror M5, and then passes through the half wave plate H1s to be converted into a laser beam L6s. Thereafter, it is introduced into the third prism lens PL1s.

The laser beam L4s is sequentially reflected by the mirrors M4 and M6, and then passes through the half wave plate H1n to be converted into a laser beam L5s. Thereafter, it is introduced into the first prism lens PL1.

The half wave plates H1, H2, H1s, and H2s may change or may not change a polarization direction of each of the laser beams. The description related to the two half wave plates H1 and H2 arranged along the optical axis OX1 is the same as described above, and the description related to the two half wave plates H1s and H2s arranged along the optical axis OX2 is also the same as that of the two half wave plates H1 and H2. Accordingly, detailed descriptions thereof will be omitted.

To obtain the linearly polarized output laser beams Lout1 and Lout2, the rotation angles of the half wave plates H1 and h2 may be formed at 45 degrees, and the rotation angles of the half wave plates H1s and h2s may be formed at 45 degrees.

One of the two half wave plates H1 and H2 may be omitted to obtain p- or s-polarized output laser beams Lout1 and Lout2, and one of the two half wave plates H1s and H2s may be omitted to obtain p- or s-polarized output laser beams.

Both of the laser beams L5s and L6 sequentially pass through the first prism lens PL1 and the second prism lens PL2 to be emitted as a laser beam L7s and a laser beam L8 that are symmetrical to each other with respect to the optical axis OX1. Similarly, both of the laser beams L6s and L10 sequentially passes through the third prism lens PL1s and the fourth prism lens PL2s to be emitted as a laser beam L8s and a laser beam L11 that are symmetrical to each other with respect to the optical axis OX2.

The description related to the first and second prism lenses PL1 and PL2 is the same as described above, and the description related to the third and fourth prism lenses PL1s and PL2s is also the same as that of the first and second prism lenses PL1 and PL2. Accordingly, detailed descriptions thereof will be omitted.

The laser beams L7s and L8 passing through the first and second prism lenses PL1 and PL2 are adjacently outputted as the output laser beam Lout1, of which a central axis may be the same as the optical axis OX1. Similarly, the laser beams L8s and L11 passing through the third and fourth prism lenses PL1s and PL2s passing through the first and second prism lenses PL1 and PL2 are adjacently outputted as output laser beams Lout2, of which a central axis may be the same as the optical axis OX2. A major-axis directional length of a cross-section of the output laser beam Lout1 may be the same as that of the laser beam L1, and a major-axis directional length of a cross-section of the output laser beam Lout2 may be the same as that of the laser beam L1s The polarization module 100 shown in FIG. 9 may be applied to the laser apparatus shown in FIG. 8.

As such, in total, at least two output laser beams Lout1 and Lout2 are generated by dividing each of at least two laser beams L1 and L1s into two laser beams, respectively, and by gathering two laser beams that are generated from different laser beams L1 and L1s from each other on the optical axes OX1 and OX2, respectively, it is possible to increase the uniformity of the output laser beams Lout1 and Lout2 while increasing the strength of the output laser beams.

While exemplary embodiments of the present invention has been described herein with reference to the figures, it is to be understood that the invention is not limited to the disclosed embodiments, but, on the contrary, is intended to cover various modifications and equivalent arrangements.

What is claimed is:
1. A polarization module comprising:
    a first lens and a second lens that, together, reduce a first-directional length of a cross-section of an incident laser beam having an optical axis;
    a polarization beam splitter that divides the laser beam from the second lens into a first laser beam and a second laser beam that are polarized in different directions with respect to each other, the optical axis passing the polarization beam splitter;
    a first half wave plate disposed on a passing path of the first laser beam;
    a second half wave plate disposed on a passing path of the second laser beam;
    a first prism lens disposed on a passing path of both the first laser beam from the first half wave plate and the second laser beam from the second half wave plate; and
    a second prism lens disposed on a passing path of both the first laser beam and the second laser beam from the first prism lens, the second lens outputting an output laser beam,
    wherein the output laser beam from the second prism lens is aligned to be symmetrical with respect to the optical axis.
2. The polarization module of claim 1, wherein an area of a cross-section of the output laser beam is substantially the same as an area of a cross-section of the incident laser beam.
3. The polarization module of claim 2, wherein the output laser beam includes a first output laser beam and a second output laser beam that have a same polarization direction.

4. The polarization module of claim 3, wherein a shape of the cross-section of the output laser beam is substantially the same as a shape of the cross-section of the incident laser beam.

5. The polarization module of claim 2, wherein the first prism lens includes a first optical plane and a second optical plane that form different angles with respect to a central axis of the first prism lens.

6. The polarization module of claim 5, wherein the second prism lens has a shape that is the same as a shape of the first prism lens, and the second prism lens is disposed in a direction that is different from that of the first prism lens.

7. The polarization module of claim 6, wherein the central axis of the first prism lens is misaligned from a central axis the second prism lens.

8. The polarization module of claim 2, wherein the first lens and the second lens are each telescopic lenses having different focal distances from each other.

9. The polarization module of claim 2, wherein
a difference between rotation angles of the first half wave plate and the second half wave plate is substantially 45 degrees.

10. The polarization module of claim 2, further comprising at least one mirror configured to reflect the second laser beam at least one time and then introduce the second laser beam into the second half wave plate.

11. A laser exposure apparatus comprising:
a polarization module; and
an optical system configured to increase a uniformity of a laser beam emitted from the polarization module more, wherein the polarization module includes:
a first lens and a second lens that, together, reduce a one-directional length of a cross-section of at least one incident laser beam having an optical axis;
a polarization beam splitter that divides the laser beam from the second lens into a first laser beam and a second laser beam that are polarized in different directions with respect to each other, the optical axis passing the polarization beam splitter;
a first half wave plate disposed on a passing path of the first laser beam;
a second half wave plate disposed on a passing path of the second laser beam;
a first prism lens disposed on a passing path of both the first laser beam from the first half wave plate and the second laser beam from the second half wave plate; and
a second prism lens disposed on a passing path of both the first laser beam and the second laser beam from the first prism lens, the second prism lens outputting an output laser beam,
wherein the output laser beam from the second prism lens is aligned to be symmetrical with respect to the optical axis.

12. The laser exposure apparatus of claim 11, wherein an area of a cross-section of the output laser beam is substantially the same as an area of the cross-section of the incident laser beam.

13. The laser exposure apparatus of claim 12, wherein the output laser beam includes a first output laser beam and a second output laser beam that have a same polarization direction.

14. The laser exposure apparatus of claim 13, wherein a shape of the cross-section of the output laser beam is substantially the same as a shape of the cross-section of the incident laser beam.

15. The laser exposure apparatus of claim 13, wherein the first output laser beam and the second output laser beam are separated from each other at a first distance, and the first distance is an integer multiple of a pitch of lenses of at least ono lens array unit included in the optical system.

16. The laser exposure apparatus of claim 13, wherein the optical system includes:
at least one lens array unit; and
a laser beam blocking member disposed to correspond to a boundary between the first output laser beam and the second output laser beam.

17. The laser exposure apparatus of claim 12, wherein the first prism lens includes a first optical plane and a second optical plane that form different angles with respect to a central axis of the first prism lens.

18. The laser exposure apparatus of claim 17, wherein the second prism lens has a shape that is the same as a shape of the first prism lens, and the second prism lens is disposed in a direction that is different from that of the first prism lens.

19. The laser exposure apparatus of claim 12, wherein
a difference between rotation angles of the first half wave plate and the second half wave plate is substantially 45 degrees.

20. The laser exposure apparatus of claim 11, wherein the at least one incident laser beam includes a first incident laser beam and a second incident laser beam, the first lens and the second lens, the polarization beam splitter, the first prism lens and the second prism lens are arranged on an optical axis of the first incident laser beam, and the laser exposure apparatus further includes a third lens and a fourth lens, an additional polarization beam splitter, and a third prism lens that are arranged on an optical axis of the second incident laser beam.

* * * * *